United States Patent [19]
Arya et al.

[11] Patent Number: 5,949,618
[45] Date of Patent: Sep. 7, 1999

[54] SOLDER BUMP ELECTRICAL CONNECTION AND METHOD FOR FABRICATION

[75] Inventors: Satya Prakash Arya; Surya Pattanaik, both of San Jose, Calif.

[73] Assignee: International Business Machines Corporation, Armonk, N.Y.

[21] Appl. No.: 08/949,986

[22] Filed: Oct. 14, 1997

[51] Int. Cl.⁶ .............................. G11B 5/48; B23K 26/00
[52] U.S. Cl. ...................... 360/106; 360/104; 219/121.64
[58] Field of Search ..................... 360/104–106, 360/108, 97.01; 219/121.64

[56] References Cited

U.S. PATENT DOCUMENTS

| | | | |
|---|---|---|---|
| 4,761,699 | 8/1988 | Ainslie et al. | 360/103 |
| 5,422,764 | 6/1995 | McIlvanie | 360/97.01 |
| 5,453,582 | 9/1995 | Amano et al. | 174/261 |
| 5,486,657 | 1/1996 | Bell et al. | 174/261 |
| 5,530,604 | 6/1996 | Pattanaik | 360/104 |
| 5,668,684 | 9/1997 | Palmer et al. | 360/106 |
| 5,757,585 | 5/1998 | Aoyagi et al. | 360/104 |
| 5,821,494 | 10/1998 | Albrecht et al. | 219/121.64 |
| 5,828,031 | 10/1998 | Pattanaik | 219/121.63 |

FOREIGN PATENT DOCUMENTS 6-216514  8/1994  Japan .

*Primary Examiner*—Jefferson Evans
*Attorney, Agent, or Firm*—John H. Holcombe

[57] ABSTRACT

A method is disclosed for fabricating an electrical connection between first and second electrical pads. A solder bump is formed on the first electrical pad covering only a portion of the pad, the portion located at a side of the first electrical pad, leaving a vacant portion of the first electrical pad at the opposite side of the first electrical pad from the solder bump. The first and second electrical pads are positioned at an intersecting angle, the second pad extending towards the first electrical pad to intersect the first electrical pad at the vacant portion of the first electrical pad and at a distance less than the height of the solder bump. The solder bump is reflowed, the surface tension thereof causing the solder bump to flow into the vacant portion of the first electrical pad to contact the second electrical pad. The movement of the solder bump towards the vacant end of the first pad allows a connection to be made despite some misalignment between the first pad and the second pad. This movement therefore allows connections to be made between termination pads of an integrated lead suspension and the conductors of a multiconductor flex cable.

5 Claims, 8 Drawing Sheets

SOLDER BUMP ELECTRICAL CONNECTION AND METHOD FOR FABRICATION

TECHNICAL FIELD

This invention relates to the fabrication of electrical connections, and, more particularly, to the fabrication of connections between conductors that are subject to imprecise alignment.

BACKGROUND OF THE INVENTION

The need for low cost manufacturing and high circuit density in the electronics industry is resulting in greater use of multilayer or laminated structures. One such application in the disk drive industry is to combine the disk drive suspension and the conductors interconnecting the head and the disk drive electronics. Briefly, disk drives are information storage devices which utilize at least one rotatable disk with concentric data tracks containing the information, a head (or transducer) for reading information from or writing information to the various tracks, and a head positioning actuator connected to the head for moving it to the desired track and maintaining it over the track centerline during read or write operations. The transducer is attached to an air bearing slider which is supported adjacent to the surface of the disk by a cushion of air generated by the rotating disk. The slider is connected to the head positioning actuator by means of a suspension.

Electrical conductors communicate information between the disk drive electronics and the head. The communicated information is data read from the disk or written to the disk by the head.

Conventionally, the electrical conductors have been individual wires, which may be strung along the suspension and connected individually to other wires which lead to the drive electronics.

With the advent of multilayered or laminated structures for disk drive suspensions, the electrical conductors are combined into the suspension structure as a single unit. Briefly, such a structure comprises a base layer of stainless steel, and a top layer of copper or copper alloy, separated by a dielectric layer like polyimide. Each of the layers are patterned so that the structure behaves as an integrated lead suspension. Such integrated lead susepnsions can be produced either by a subtractive or additive process. The electrical leads in such suspensions terminate in a set of electrical pads located linearly adjacent each other at the ends of associated parallel conductors.

Multiconductor flex cables are widely used in the electronics industry, and are used in disk drives for connecting the conductors from the heads, at the back end of the actuator, to the drive electronics. The actuator and the suspension move the head from track to track, while the drive electronics are stationary. Thus, the multiconductor flex cable provides the flexible connection accommodating the head movement.

Typically, such cables comprise a polyimide base layer and flex thin leads disposed thereon, with a top cover laminated to the base layer. The leads are most often formed by subtractive processes wherein a copper lamination on the base layer is etched to form a plurality of parallel conductors for the full length of the base layer. Other processes (i.e., additive) are sometimes used to provide the parallel conductors.

Individual wires, when used to connect the head transducer to the drive electronics flex cable, although more labor intensive, still allow each wire to be positioned precisely to make an electrical connection, as the individual wires are flexible. The advent of integrated lead suspensions, together with multiconductor flex cables, requires precise alignment of all of the pads of integrated lead suspension conductors to the corresponding pads of the flex cable conductors, as these conductors, unlike wires, can not be manipulated. One approach at making an electrical connection between a multiconductor flex cable and electrical pads at the termination ends of the conductors of an integrated lead suspension is to place the cable and electrical pads of the suspension at right angles to one another with solder bumps on the electrical pads, and heating the solder bumps at the connection. However, this requires precise alignment of the pads on both the suspension and the multiconductor flex cable. Without complete alignment, making electrical connections at all of the pads is very difficult, and is prone to failure.

SUMMARY OF THE INVENTION

An object of the present invention is to provide a solder bump reflow connection process which eliminates some of the difficulties in alignment.

A method is disclosed for fabricating an electrical connection between first and second electrical pads. A solder bump is formed on the first electrical pad covering only a portion of the pad, the portion located at a side of the first electrical pad, leaving a vacant portion of the first electrical pad at the opposite side of the first electrical pad from the solder bump. The first and second electrical pads are positioned at an intersecting angle, the second pad extending towards the first electrical pad to intersect the first electrical pad at the vacant portion of the first electrical pad and at a distance less than the height of the solder bump. The solder bump is reflowed, the surface tension thereof causing the solder bump to flow into the vacant portion of the first electrical pad to contact the second electrical pad.

The movement of the solder bump towards the vacant end of the first pad allows a connection to be made despite some misalignment between the first pad and the second pad. This movement therefore allows connections to be made between termination pads of a or multilayered suspension and the conductors of a multiconductor flex cable.

A suspension assembly for a data storage disk drive is also disclosed, having a slider with a transducer thereon, a suspension formed as a laminated or multilayered structure having a patterned conductive layer of at least one conductor lead electrically connected to the transducer at a first end, the conductor terminating in a termination pad at a second end, a flex cable conductor forming an intersecting angle with respect to the termination pad towards one end of the pad and spaced from the termination pad, and a solder bump originally positioned at the opposite side of the pad, leaving a portion of the pad at the one end vacant, and reflowed to extend over the pad into the vacant portion of the termination pad to contact the flex cable conductor.

For a fuller understanding of the present invention, reference should be made to the following detailed description taken in conjunction with the accompanying drawings.

DETAILED DESCRIPTION OF THE INVENTION

Figure 1:
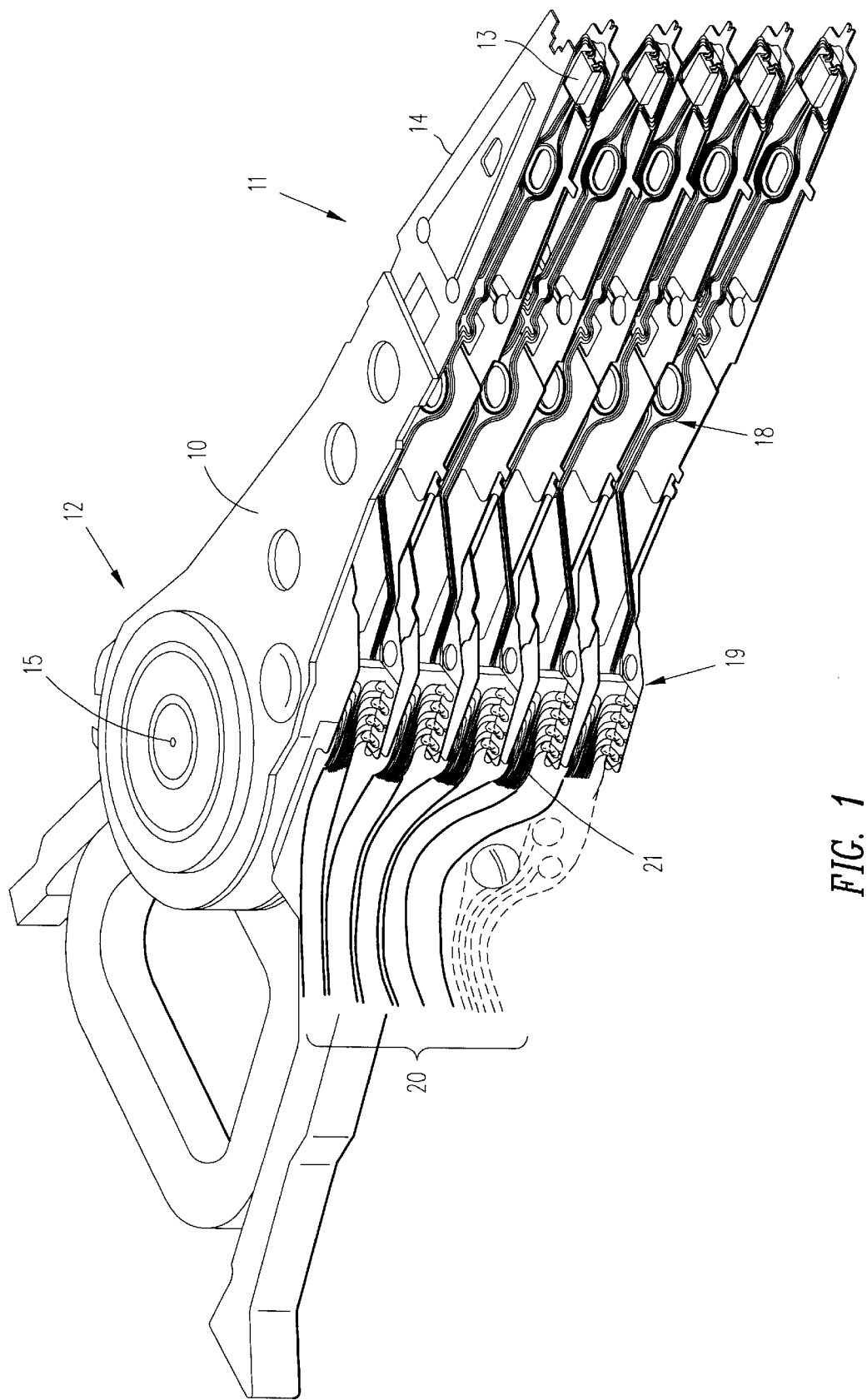
FIG. 1 is a perspective view illustration of a set of disk drive integrated lead suspensions and the electrical connections to multiconductor flex cables of the present invention.

Referring to FIG. 1, a head positioning actuator 12 is illustrated, having arm assemblies 11 which consist of arms 10 and suspensions 14 for a magnetic disk drive. As described above, disk drives, such as magnetic disk drives are information storage devices with utilize at least one rotatable disk with concentric data tracks containing the information, a head (or transducer) for reading information from or writing information to the various tracks, and the head positioning actuator 12 connected to the head form moving it to the desired track and maintaining it over the track centerline during read or write operations. The transducer is mounted on an air bearing slider 13 which is supported adjacent the surface of the disk by a cushion of air generated by the rotating disk. The slider 13 is connected to the head positioning actuator 12 by means of the arm assembly 11. The magnetic disk drive will be described in more detail hereinafter.

Still referring to FIG. 1, each slider 13 is mounted on a suspension 14. One of the suspensions 14 is mounted on each arm 10 and forms the arm assembly 11. The arms 10 are mounted on the actuator mechanism 12, which pivots about pivot axis 15 to move the heads in the lateral direction to position the heads from track to track.

The suspension 14 is an integrated lead suspension in which the electrical conductors are combined into the suspension structure as a single unit. The integrated lead suspension is a layered composite comprising a base layer of stainless steel with patterned electrical leads 18 formed thereon, separated by an dielectric layer. The electrical leads 18 terminate in a set of electrical pads 19 located linearly adjacent one another at the ends of associated parallel conductors. Such an integrated lead suspension is commercially known as "Trace Suspension Assembly" (TSA), or "Circuit Integrated Suspension" (CIS).

Figure 2:
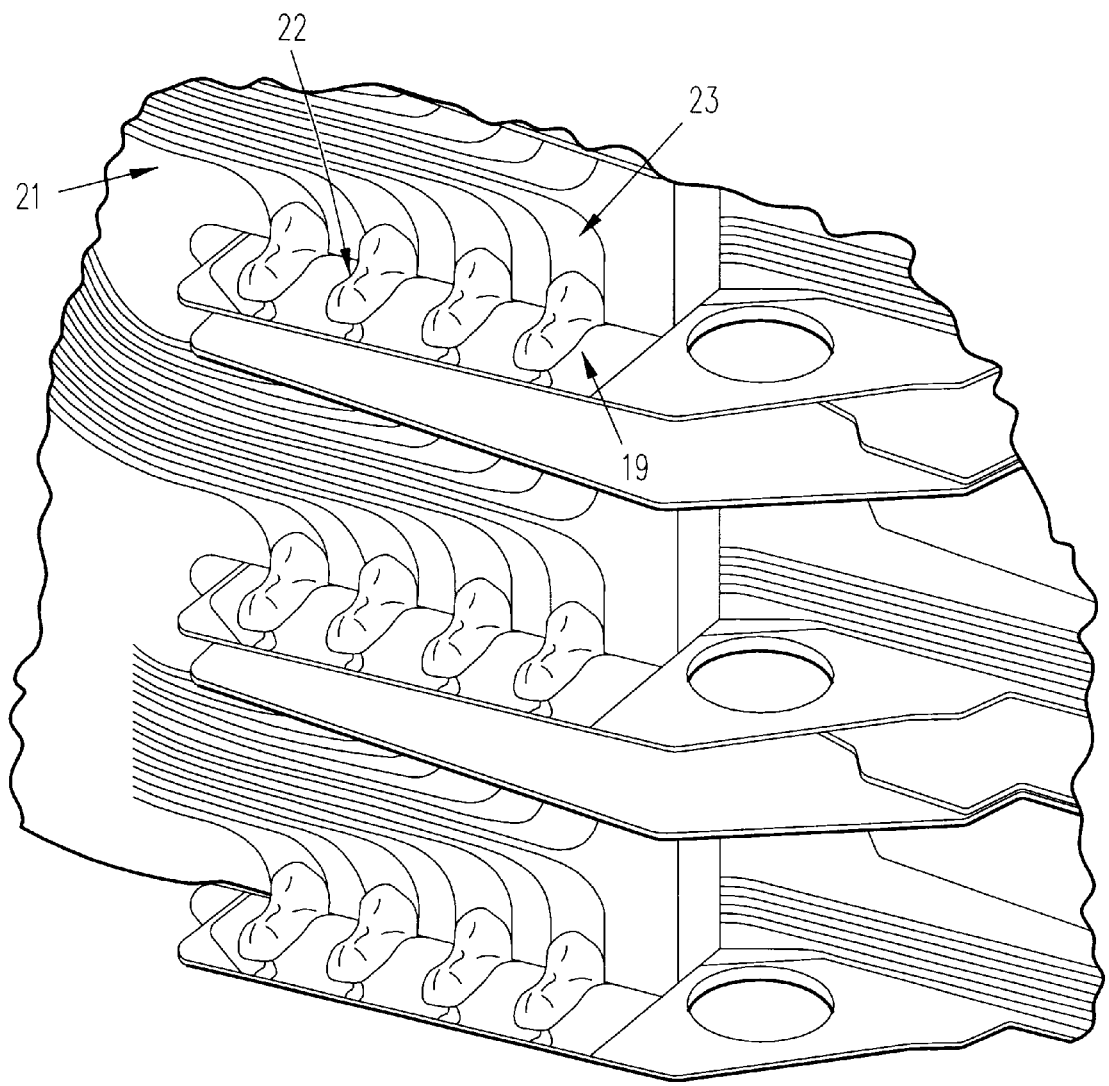
FIG. 2 is an enlarged perspective view of the electrical connections of FIG. 1.

Referring to FIGS. 1 and 2, a set 20 of multiconductor flex cables 21 are provided to connect the drive electronics of the magnetic disk drive to the integrated lead suspension leads 18 at electrical pads 19. Alternatively, the set 20 of multiconductor cables may instead be a single multiconductor cable which is split into several subcables 21.

Individual conductors 23 of the multiconductor flex cables 21 are connected to the electrical pads 19 by solder connections 22.

Figure 3:
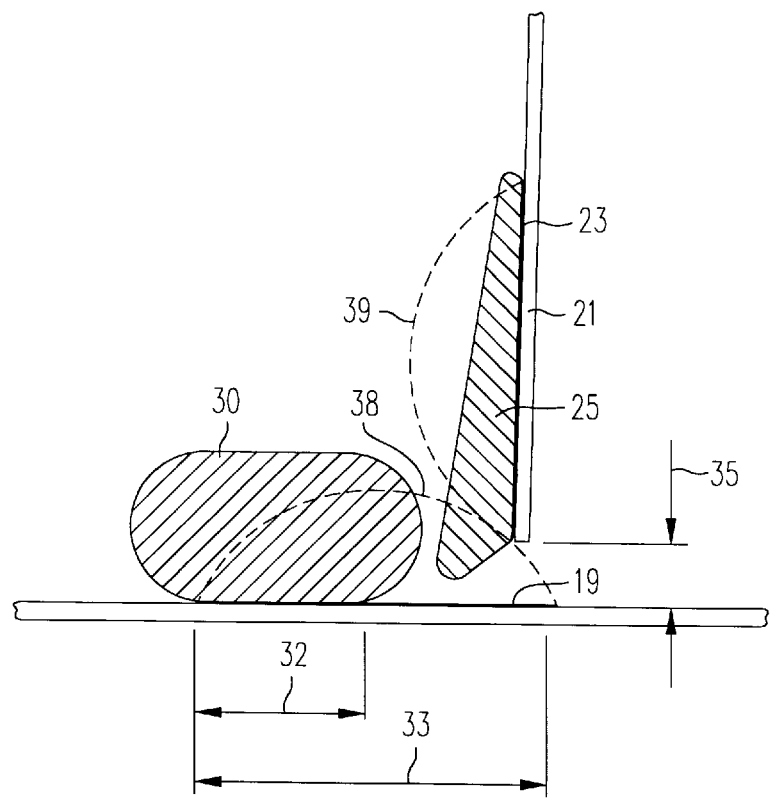
FIG. 3 is a side view illustration of a solder bump placed on a first pad and of a second conductor or pad, both positioned in the initial positions in accordance with the present invention.
Figure 4:
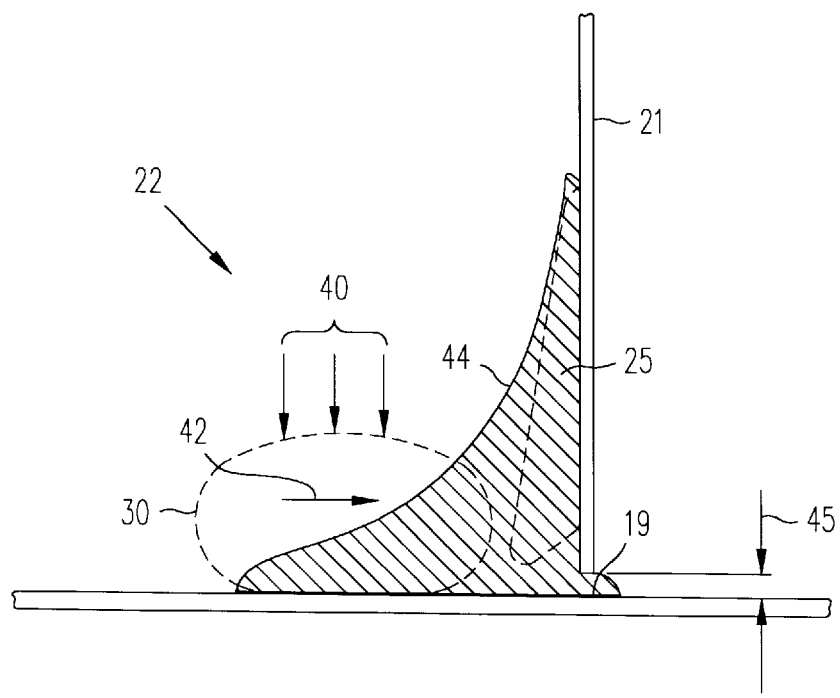
FIG. 4 is a side view illustration of the reflow of the solder bump of FIG. 3 to make a connection in accordance with the present invention.

FIGS. 3 and 4 illustrate one embodiment of the method of the present invention for producing a solder connection 22.

Multiconductor flex cable conductor 23 may be provided with a flattened solder "bump" 25, which is solder formed into a horizontal or tapered shape. The preformed solder bump 25 may be conventionally supplied by the supplier of the multiconductor flex cable 21.

The electrical pad 19, or first pad, is formed as an extension to a laminated lead 18. A solder bump 30 is formed on the electrical pad 19, but covering only a portion of the pad and at one side of the pad 19. The solder bump 30 covers the partial width 32 of the total width 33 of the electrical pad 19. Preferably, the partial width 32 is from 50 to 75 percent of the total width 33. The solder bump 30, by covering only the portion of the pad 19, leaves a vacant portion of the electrical pad at the opposite side of the electrical pad from the solder bump.

The multiconductor flex cable conductor 23, or second pad, and the electrical pad 19 are positioned at an intersecting angle, with the flex cable conductor 23 extending towards the electrical pad 19 to intersect the electrical pad at the vacant portion of the electrical pad and at a distance 35 less than the height of the solder bump 30. The position of the solder bump 30 at one side of the electrical pad 19 may be called a solder "dam".

If the solder bump 30 were to be reflowed, the surface tension thereof would cause the solder bump 30 to flow into the vacant portion of the electrical pad 19 and assume the profile 38. If the preformed solder bump 25 on the flex cable conductor 23 were reflowed separately, it would assume the profile 39.

FIG. 4 illustrates application of a heating source to solder bump 30 to reflow the solder bump, which runs in direction 42 to cover the bare portion of the electrical pad 19. The solder bump 30 therefore makes contact with the solder bump 25, heats it, causes it to reflow towards the bottom portion of the solder bump 25, fills the gap to make the joint 44, and forms the connection 22. The joint 44 is formed before the volume of the solder bump 25 can form the profile 39. As the joint 44 is formed, solder surface tension reduces the gap 35, so that gap 45 of FIG. 4 is smaller than gap 35 of FIG. 3, and perhaps is reduced to zero.

Although the joint 44 has been illustrated in the context of a magnetic disk drive, the present invention may be employed to make any connection between two conductors.

Alternatively, both the first and the second electrical pads may have solder bumps positioned at one side of the corresponding pads. Thus, with the pads at an intersecting angle, reflowing both solder bumps causes the solder bumps to run together to form a connection.

Alternatively, only one electrical pad may have the solder bump and the other pad is without any solder. This may be possible for lower tolerances in low solder volume situations.

Figure 5A:
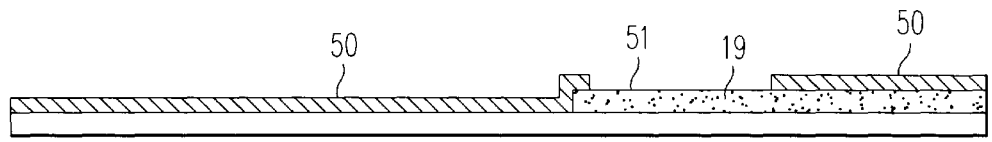
FIGS. 5A–D are partially cut away illustrations of the electrical pad of FIG. 3, showing the process steps for placing the solder bump at one side of the pad.
Figure 5B:
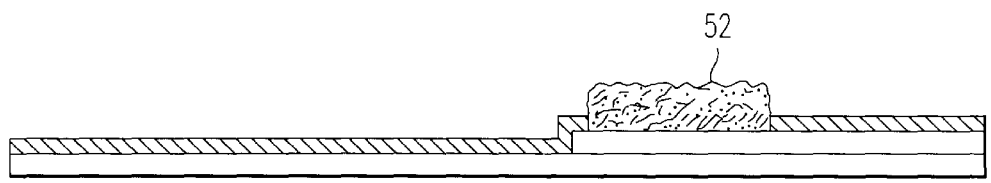
Figure 5C:
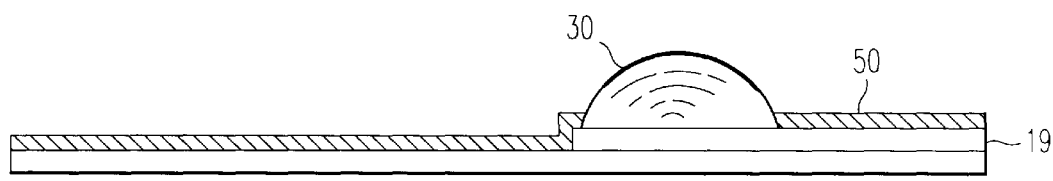
Figure 5D:
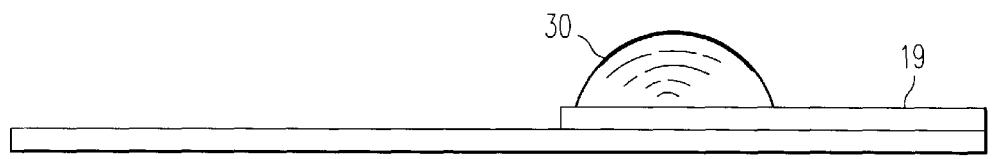
Figure 6B:
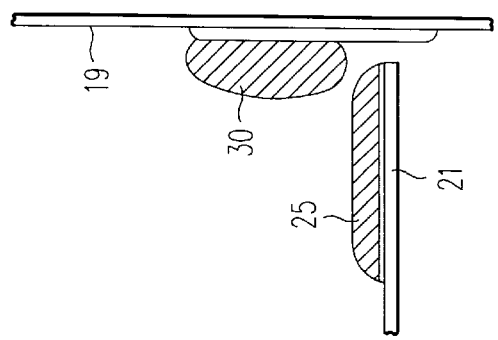
FIGS. 6A and B are plan and side view illustrations, respectively, of solder bumps fabricated or placed on integrated lead suspension termination pads and of conductors of a multiconductor flex cables, both positioned in the initial positions in accordance with the present invention for the connections of FIG. 2.
Figure 6A:
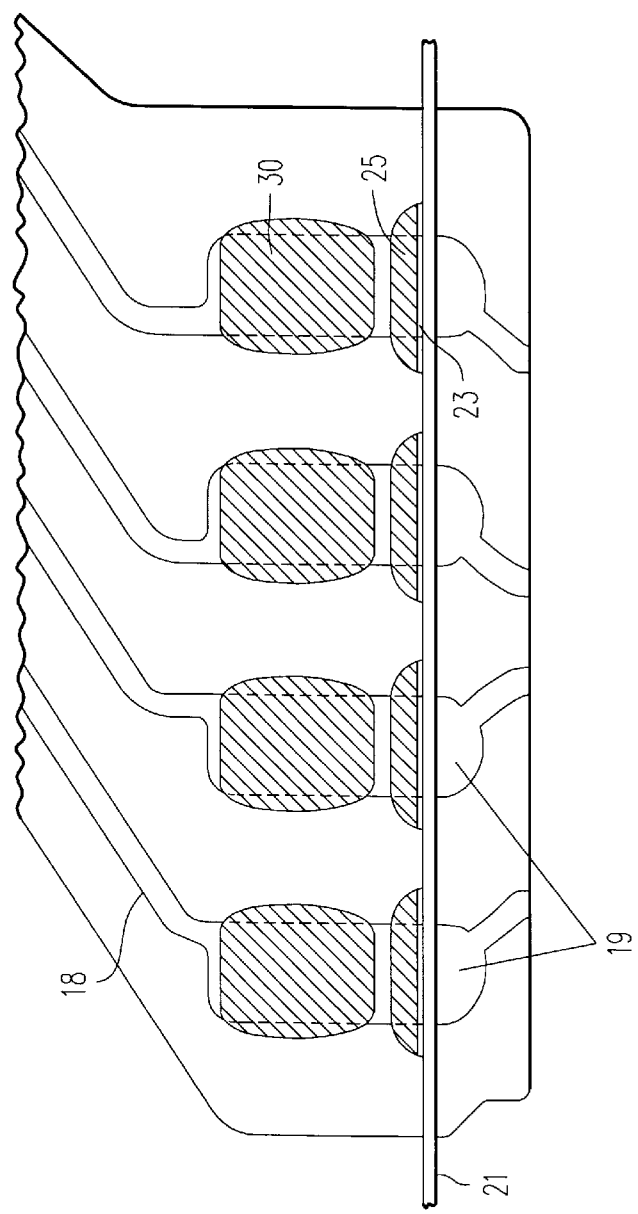
Figure 7B:
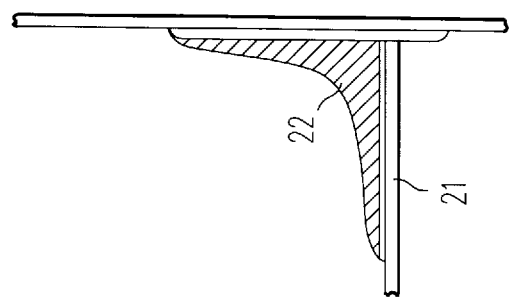
FIGS. 7A and B are plan and side view illustrations, respectively, of the reflowed solder bump connections in accordance with the present invention, to make the connections of FIG. 2.
Figure 7A:
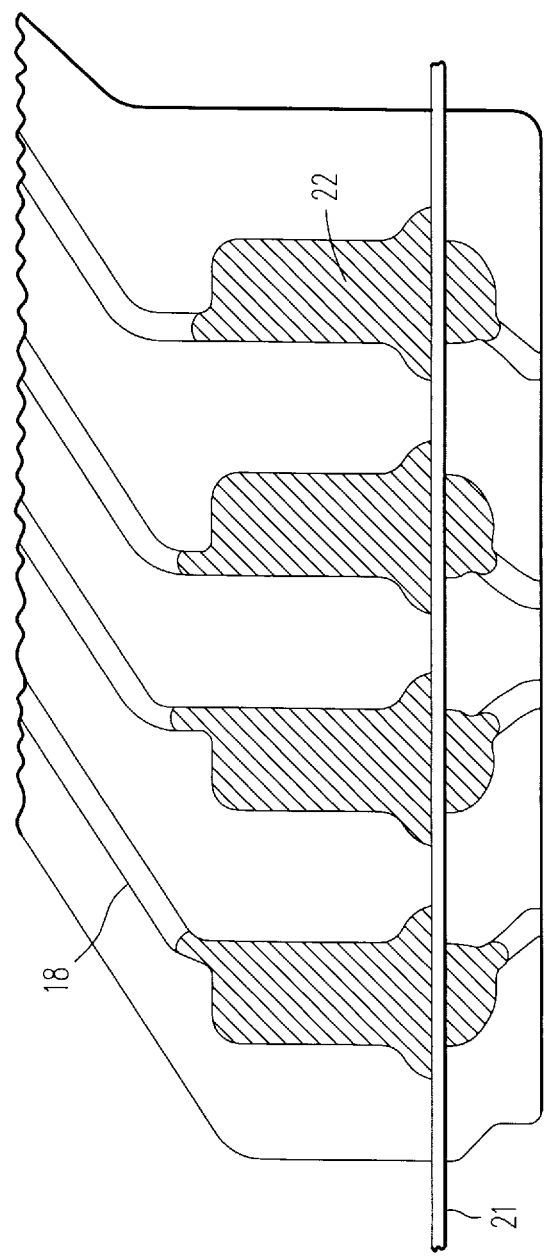

FIGS. 5A–D illustrate the process for placing the solder bump 30 at one side of an electrical pad 19, covering only a portion of the pad, and forming a solder dam. In FIG. 5A, a removable resist (or any other suitable material) mask 50 is laid down with an opening 51 at a portion of the electrical pad 19 and at one side of the electrical pad. In FIG. 5B, a solder paste 52 is placed in the unmasked opening 51. The volume of the solder paste 52 is adjusted such that, when reflowed, the total volume of the solder dam 30 is at least equal to that of a normal solder bump which covers the entirety of the electrical pad. In FIG. 5C, the solder paste 52 is heated to reflow and form the solder bump 30, positioned in the opening in mask 50 at one side of the electrical pad 19. In step 5D, the removable resist mask 50 is removed, leaving the solder bump 30 covering only a portion of the electrical pad 19, and at one side of the electrical pad, forming the solder dam. Other methods of solder application like solder preform placement and reflow or solder jetting, etc., can also be used to form the solder "dam" 30.

FIGS. 6A-B and 7A-B illustrate one embodiment of the method of the present invention for producing solder connections 22 for a plurality of conductors 23 of multiconductor flex cable 21 and electrical pads 19 of the integrated lead suspension conductors 18.

The various conductors 23 of the flex cable 21 and the electrical pads 19 are difficult to align. Even though one of the conductors 23 and electrical pads 19 may be aligned, the remainder of the conductors and pads may be misaligned due to tolerance buildup. The tolerance buildup is an accumulation of several factors. One factor is an incorrect location of the conductors or pads. The pads 19 or conductors 23 may be located incorrectly as the result of the original screening, or the cable may be misaligned in angle when placed adjacent to the electrical pads. Another factor is the height of the solder bump 30 or the solder bump 25. The height is a function of the volume of solder paste applied in the masking step. As an example, with an electrical pad 19 which is 300 microns wide and 850 microns long, the tolerance buildup may comprise 100 microns in height and 200 microns in the lateral direction for one of the pad 19 to conductor 23 junctions. The solder dam of the present invention is able to handle misalignments 50 percent greater than that of the tolerance buildup.

As with respect to the single conductor, described above, each of the conductors 23 of the multiconductor flex cable 21 may be provided with a preformed flattened solder bump 25. The preformed solder bump 25 may be conventionally supplied by the supplier of the multiconductor flex cable 21.

The electrical pads 19 are formed as extensions to the laminated leads 18. A solder bump 30 is formed on each of the electrical pads 19, but covering only a portion of the pad and at one side of the pad 19, and is called a solder dam. The solder dam 30, by covering only the portion of the pad 19, leaves a vacant portion of the electrical pad at the opposite side of the electrical pad from the solder dam.

The multiconductor flex cable 21 and the electrical pads 19 are positioned at an intersecting angle, with the flex cable conductors 23 extending towards the electrical pads 19 to intersect the electrical pads at the vacant portion of the electrical pad and at a distance less than the height of the solder dams 30.

A heating source is directed at the solder dams 30 to reflow the solder dams, which run to cover the bare portion of the corresponding electrical pads 19. The solder dams 30 therefore make contact with the corresponding solder bumps 25, heating them, causing the reflow of the bottom portion of the solder bumps 25 and filling the gaps to make the connections 22. As the connections are formed, solder surface tension pulls electrical pads 19 towards 23, reducing the gap between the electrical pads 19 and the multiconductor flex cable conductors 23, perhaps to zero. Thus, the present invention provides a solder bump reflow connection which eliminates some of the difficulties in alignment.

Figure 8:
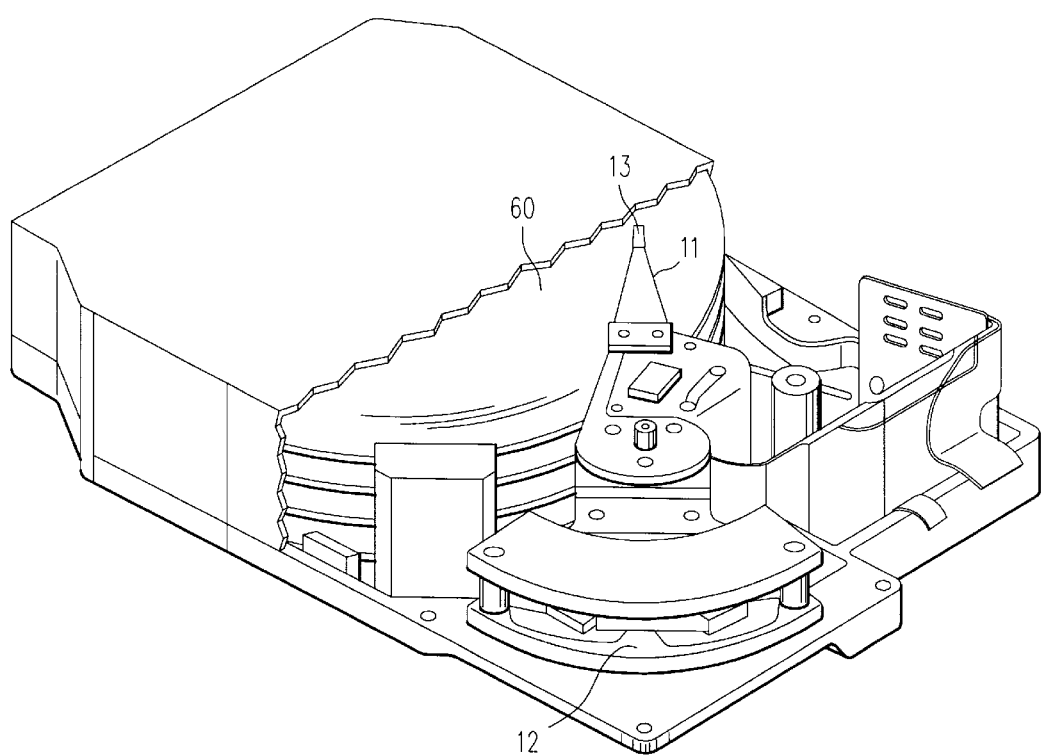
FIG. 8 is a perspective illustration of a magnetic disk drive employing the suspensions of FIG. 1.
Figure 9:
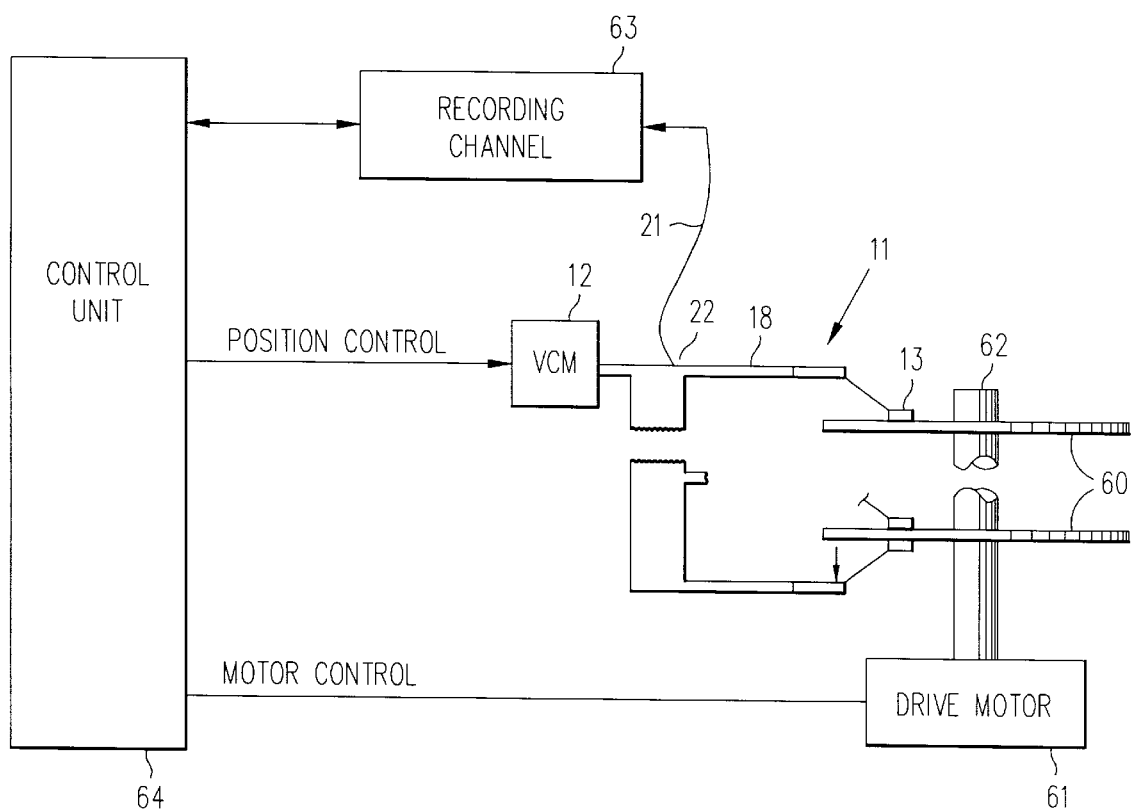
FIG. 9 is a block diagram of the electronics of the magnetic disk drive of FIG. 8.

FIGS. 8 and 9 illustrate an exemplary magnetic disk drive including the connections of the present invention. Magnetic disk drives store information on a magnetic recording surface of rotatable disks 60 with concentric data tracks containing the information. A head (or transducer) for reading information from or writing information to the various tracks on the recording surface is mounted on an air bearing slider 13. The air bearing slider 13 is supported adjacent the surface of the disk 60 by a cushion of air generated by the rotating disks, as the disks, mounted on a spindle 61 are rotated by a drive motor 62. The slider 13 is connected to a head positioning actuator 12 by means of an arm assembly 11. Information read from a track is supplied from the corresponding head on slider 13 to the conductors 18 over connections 22 to multiconductor flex cable 21 to a recording channel 63. Data to be recorded is received from the multiconductor flex cable 21 and transmitted over connections 22 and conductors 18 to the head.

Referring to FIGS. 1 and 2, four connections 22 are shown connected to the conductors 18, for each head of a slider 13. The typical magnetic disk drive head includes two transducers, for, respectively, reading and writing data on the associated track. Thus, each transducer has two leads 18, for a total of four leads.

Referring again to FIGS. 8 and 9, the recording channel 63 amplifies and decodes the signals received from the head and encodes data to be recorded and supplies recording signals to the head for recording. The recording channel is connected to a control unit 64 and supplies the decoded data to the control unit, while receiving data to be recorded from the control unit.

Some of the data received by the recording channel 63 is servo data which is decoded by the control unit 64 and provided to head positioning actuator 12 to move the head to the desired track and maintain it over the track centerline during read or write operations.

The connections 22 of the present invention are particularly advantageous for usage in magnetic disk drives where the design of the drive requires alignment of a multiconductor flex cable with conductors of a integrated lead suspension. It is expected that integrated lead suspensions of different types may be employed with other types of data storage devices, and the connections of the present invention may also be employed therein.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method for fabricating an electrical connection between first and second electrical pads, comprising the steps of:

forming a first solder bump on said first electrical pad covering only a portion of said pad, said portion located at a side of said first electrical pad, leaving a vacant portion of said first electrical pad at the opposite side of said first electrical pad from said solder bump;

forming a second solder bump on said second electrical pad;

positioning said first and second electrical pads at substantially a right intersecting angle, said second pad and said second solder bump extending towards said first electrical pad to intersect said first electrical pad at said vacant portion of said first electrical pad and at a gap of a distance less than the height of said solder bump; and reflowing said first solder bump, the surface tension thereof causing said first solder bump to flow into said vacant portion of said first electrical pad to contact said second solder bump of said second electrical pad, thereby reflowing said second solder bump, forming a solder joint therebetween, the surface tension of said solder joint tending to reduce said gap distance, thereby forming said electrical connection.

2. The method for fabricating an electrical connection of claim 1, wherein said forming step portion of said first electrical pad covered by said solder bump is between 50% and 75% of the area of said first electrical pad.

3. A method for fabricating an electrical connection between a flex cable conductor and a termination pad of a conductive lead structure of an integrated lead suspension, said suspension mechanically supporting a slider for a data storage device, comprising the steps of:

forming a first solder bump on said termination pad covering only a portion of said pad, said portion located at a side of said termination pad, leaving a vacant portion of said termination pad at the opposite side of said termination pad from said first solder bump;

forming a second solder bump on said flex cable conductor;

positioning said termination pad and said flex cable conductor at substantially a right intersecting angle, said flex cable conductor and said second solder bump extending towards said termination pad to intersect said termination pad at said vacant portion of said termination pad and at a gap of a distance less than the height of said first solder bump; and reflowing said first solder bump, the surface tension thereof causing said first solder bump to flow into said vacant portion of said termination pad to contact said second solder bump of said flex cable conductor, thereby reflowing said second solder bump, forming a solder joint therebetween, the surface tension of said solder joint tending to reduce said gap distance, thereby forming said electrical connection.

4. The method for fabricating an electrical connection of claim 3, wherein said forming step portion of said first electrical pad covered by said solder bump is between 50% and 75% of the area of said first electrical pad.

5. A suspension assembly for a data storage disk drive, comprising:

a slider having a transducer thereon;

a suspension formed as a multilayer structure having a patterned conductive layer of at least one conductor electrically connected to said transducer at a first end, said conductor terminating in a termination pad at a second end;

a flex cable conductor forming substantially a right intersecting angle with respect to said termination pad towards one end of said pad and spaced from said termination pad; and a solder joint electrical connection formed from a first solder bump on said termination pad and a second solder bump on said flex cable conductor, said first solder bump originally positioned at the opposite end of said termination pad from said one end, leaving a portion of said termination pad at said one end vacant and forming a gap between said first and said second solder bumps of a distance less than the height of said first solder bump, and reflowing said first solder bump, the surface tension thereof causing said first solder bump to flow into said vacant portion of said termination pad to contact said second solder bump of said flex cable conductor, thereby reflowing said second solder bump, forming said solder joint therebetween, the surface tension of said solder joint tending to reduce said gap distance.

* * * * *